US007694268B2

(12) United States Patent
Dick

(10) Patent No.: US 7,694,268 B2
(45) Date of Patent: Apr. 6, 2010

(54) METHOD FOR OPTIMIZATION OF OPTICAL PROXIMITY CORRECTION

(75) Inventor: Gregory J. Dick, Beacon, NY (US)

(73) Assignee: International Business Machines Corporation, Armonk, NY (US)

(*) Notice: Subject to any disclaimer, the term of this patent is extended or adjusted under 35 U.S.C. 154(b) by 221 days.

(21) Appl. No.: 11/833,465

(22) Filed: Aug. 3, 2007

(65) Prior Publication Data

US 2009/0037867 A1    Feb. 5, 2009

(51) Int. Cl.
*G06F 17/50* (2006.01)

(52) U.S. Cl. .............................. 716/19; 716/20; 716/21; 430/5; 430/30

(58) Field of Classification Search ............. 716/19–21; 430/5, 30
See application file for complete search history.

(56) References Cited

U.S. PATENT DOCUMENTS

| 5,294,800 | A |   | 3/1994  | Chung et al. |
| 5,366,847 | A | * | 11/1994 | Powers .......................... 430/296 |
| 6,570,174 | B1 | * | 5/2003  | Tounai et al. .......... 250/559.26 |
| 6,737,199 | B1 |   | 5/2004  | Hsieh |
| 7,022,439 | B2 | * | 4/2006  | Luttrell ........................... 430/5 |
| 7,055,127 | B2 |   | 5/2006  | Pierrat et al. |

* cited by examiner

*Primary Examiner*—Jack Chiang
*Assistant Examiner*—Nghia M Doan
(74) *Attorney, Agent, or Firm*—DeLio & Peterson, LLC; Peter W. Peterson

(57) ABSTRACT

A method of designing and forming a mask used for projecting an image of an integrated circuit design. After providing a mask element corresponding to a portion of a design of an integrated circuit layout, the method includes correcting the mask element using OPC techniques, and fracturing the OPC-corrected mask element into a plurality of polygonal segments. The method then includes identifying along an edge of the mask element a polygon edge having a thickness less than that which can be normally reproduced by a mask writer, and modifying configuration of the identified mask element segment to add or subtract length to an end of the polygon to create a corrected mask element having increased resolution by the mask writer. The method then includes using an electron beam or other mask writer to form a mask having the mask element with modified configuration.

19 Claims, 7 Drawing Sheets

METHOD FOR OPTIMIZATION OF OPTICAL PROXIMITY CORRECTION

BACKGROUND OF THE INVENTION

1. Field of the Invention

This invention relates to semiconductor fabrication and, in particular, to an improved method for creating a mask pattern of an integrated circuit (IC) for use in lithographic processing.

2. Description of Related Art

Integrated circuits are fabricated by lithographic techniques, where energy beams transmit integrated circuit images or patterns on photomasks to photosensitive resists on semiconductor wafer substrates. The circuit image on the photomask may not be reproduced precisely on the substrate, in part because of optical effects among transmitted and blocked energy passing through the photomask. Optical proximity correction (OPC) has been employed as a key enabling resolution enhancement technique required to meet image size control requirements imposed by state-of-the-art integrated circuit product programs. OPC is essentially the deliberate and proactive distortion of photomask patterns to compensate for systematic and stable errors.

The mask patterns for the elements corresponding to the desired integrated circuit design may be made by a mask writer. A mask writer is typically a variable shaped electron beam tool, such as that available from JEOL Ltd. of Tokyo, Japan. Integrated circuit shapes can be patterned on a semiconductor wafer by the photomask made with an electron beam tool. The mask elements corresponding to portions of a design of an integrated circuit layout are generally made of opaque materials deposited on a quartz substrate.

Typically, designs for the mask elements are made by the following procedure: 1) create the design based on design manual rules; 2) run design rule checks (DRC) on the design data; 3) update the design if any problems are found; 4) run the DRC-clean data through OPC; 5) run the post-OPC data through OPC verification (sometimes referred to as ORC); 6) update the design and/or OPC process if any problems are found; 7) run the final post-OPC data through mask rule checks (MRC); 8) update the design and/or OPC process if any problems are found; and 9) run the DRC/ORC/MRC-clean data through fracturing for the mask writer. These steps are, more or less, run sequentially with potential re-running of various steps as noted above.

The designs for the mask elements are generally made using polygonal shapes. OPC deals with edges of the polygons. Mask fracturing techniques convert those polygons into primitive shapes, generally simple rectangles that can be written by the mask writer. Often the mask writer will be able to resolve larger shapes better than smaller shapes. Long, thin shapes, referred to herein as "slivers," that are generated by the fracturing software may resolve poorly when the mask writer attempts to create the sliver shape for the photomask. If the sliver is small enough, e.g., in the thickness dimension, it may essentially not resolve at all.

SUMMARY OF THE INVENTION

Bearing in mind the problems and deficiencies of the prior art, it is therefore an object of the present invention to provide an improved method for optimization of optical proximity correction of mask elements used to project an integrate circuit design in a lithographic projection system.

It is another object of the present invention to provide improved resolution by beam-type mask writers of mask patterns corresponding to integrated circuit designs.

A further object of the invention is to provide improved semiconductor wafer yield by enhancing resolution of projected circuit images.

Still other objects and advantages of the invention will in part be obvious and will in part be apparent from the specification.

The above and other objects, which will be apparent to those skilled in the art, are achieved in the present invention which is directed to a method of designing a mask used for projecting an image of an integrated circuit design. After providing a mask element corresponding to a portion of a design of an integrated circuit layout, the method comprises correcting the mask element using optical proximity correction (OPC) techniques, and dividing the OPC-corrected mask element into a plurality of polygonal segments. The method then includes identifying a segment of the OPC-corrected mask element having potentially lower resolution by a mask writer used to design the mask, and modifying configuration of the identified mask element segment to add or subtract area to an end of the segment to create a corrected mask element having increased resolution by the mask writer.

The configuration of the identified mask element segment is modified by increasing length of the identified segment, or by reducing length of the identified segment. The segment has a thickness of less than that which can be normally reproduced on the mask.

In a preferred embodiment, the OPC-corrected mask element having potentially lower resolution comprises a sliver created by fracturing the mask element. The configuration of the identified mask element segment may be modified by increasing or reducing the length of the sliver.

Preferably, the segment of the OPC-corrected mask element having potentially lower resolution by a mask writer is identified by fracturing the mask element to a plurality of polygonal segments, identifying along one edge of the mask element a polygon edge having a thickness less than that which can be normally reproduced on the mask, and changing the length of the polygon in a direction normal to the mask element such that the polygon merges with an adjacent polygonal segment. The polygon may be lengthened or shortened on the polygon edge along the one edge of the mask element, or on the polygon edge opposite the one edge of the mask element.

The method then may further include forming a mask having the mask element with modified configuration, preferably using an electron bean mask writer.

In another aspect, the present invention is directed to a method of forming a mask used for projecting an image of an integrated circuit design comprising providing a mask element corresponding to a portion of a design of an integrated circuit layout, correcting the mask element using optical proximity correction (OPC) techniques, and fracturing the OPC-corrected mask element into a plurality of polygonal segments. The method then includes identifying along an edge of the mask element a polygon edge having a thickness less than that which can be normally reproduced by a mask writer used to design the mask, and modifying configuration of the identified mask element segment to add or subtract length to an end of the polygon to create a corrected mask element having increased resolution by the mask writer. The method then includes using an electron beam or other mask writer to form a mask having the mask element with modified configuration.

The polygon may be shortened or lengthened on the polygon edge along the one edge of the mask element, or on the polygon edge opposite the one edge of the mask element.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-8 of the drawings in which like numerals refer to like features of the invention.

Figure 1:
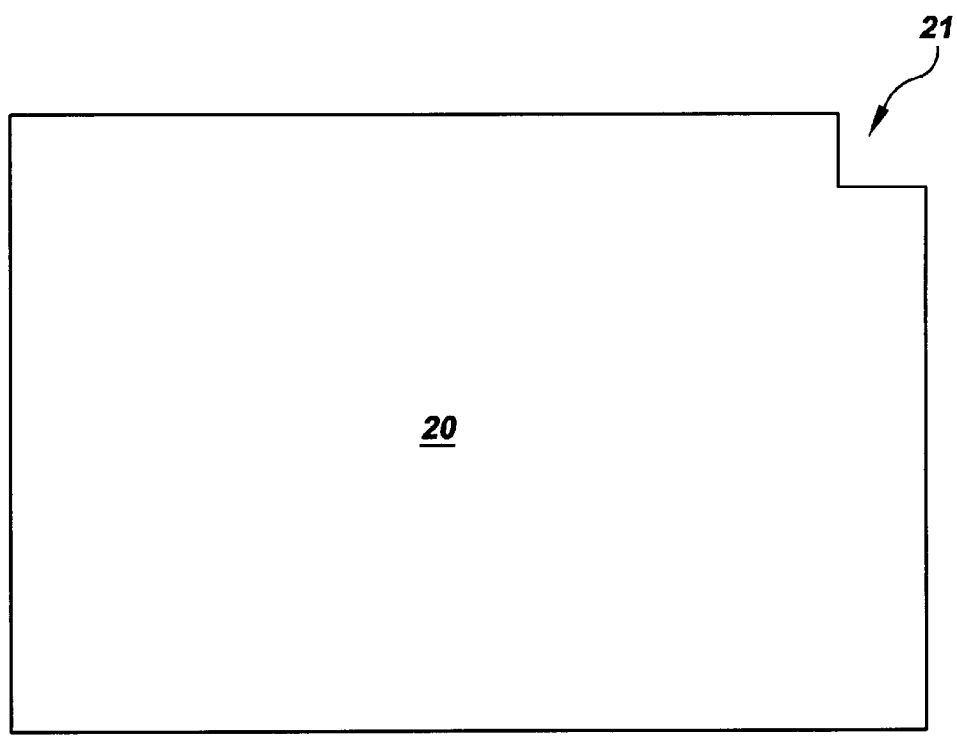
FIG. 1 is a plan view of a relatively simple OPC created polygonal shape for a photomask element, corresponding to a portion of an integrated circuit design.
Figure 2:
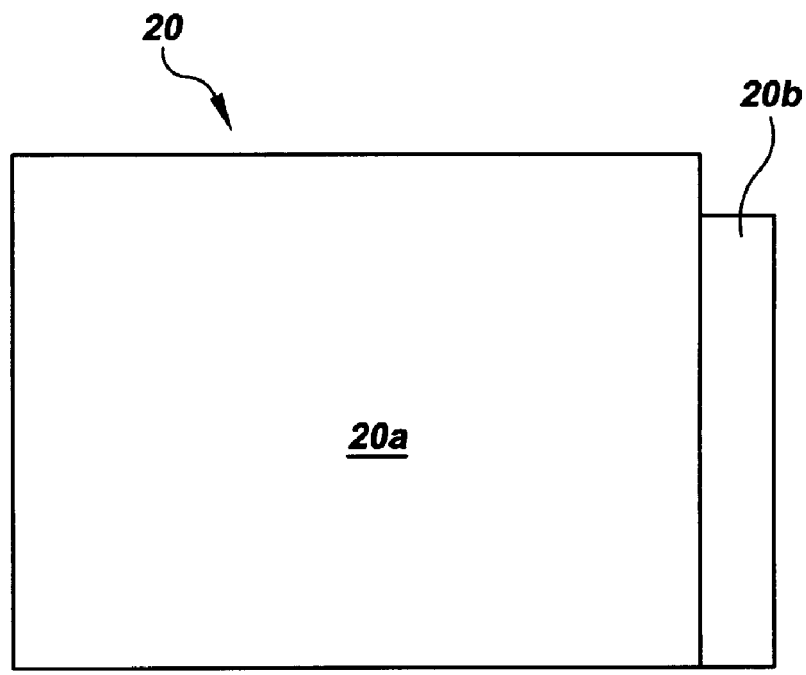
FIGS. 2 and 3 are plans view of the mask shape of FIG. 1 after vertical and horizontal fracturing.
Figure 3:
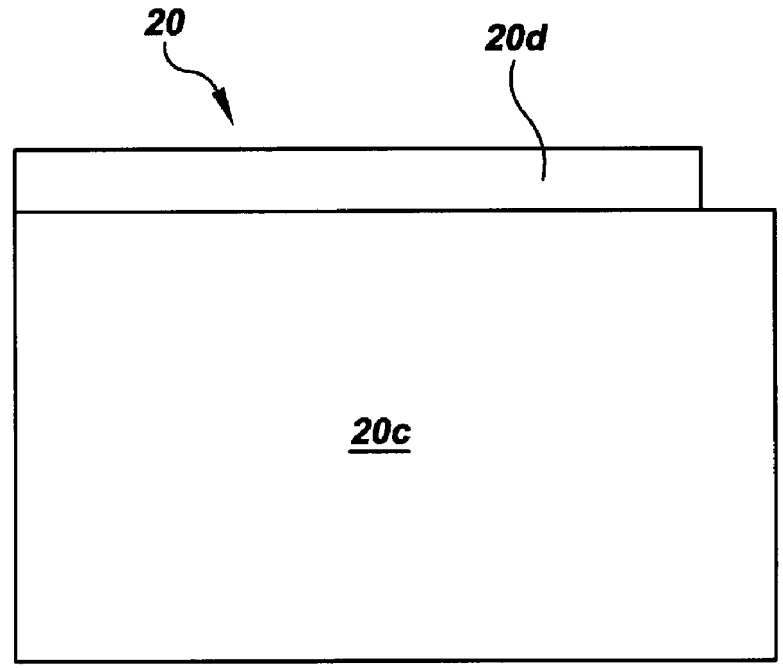

Optical proximity correction of designs for mask opaque segments involves correction to the edges of polygons. For example, FIG. 1 shows a rectangular shape 20 for a mask element that has 5 corners, two of which are caused by a smaller rectangular excision from shape 20. After conventional mask fracturing, the "jogs" in shape 20 force a conversion to simple rectangles 20a, 20b, as shown in FIG. 2, or simple rectangles 20c, 20d as shown in FIG. 3. The presence after fracturing of the relatively thin rectangular shapes 20b or 20d, referred to herein as "slivers," has been determined to cause resolution problems when the mask elements are projected onto the resist layer on the wafer. The slivers to which the present invention is directed are those shapes that have a thickness substantially less than that which a given mask maker can normally or faithfully reproduce on a mask. The mask writer will be able to resolve larger shapes, e.g., shapes 20a (FIG. 2) and 20c (FIG. 3) better than the smaller, thinner shapes 20b (FIG. 2) and 20d (FIG. 3). As described above, if the sliver 20b or 20d is small or thin enough, it may not be resolved at all by the mask writer. The present invention is directed to the modification of post-OPC shapes by way of minor edge movement to eliminate the fracturing slivers.

Figure 4:
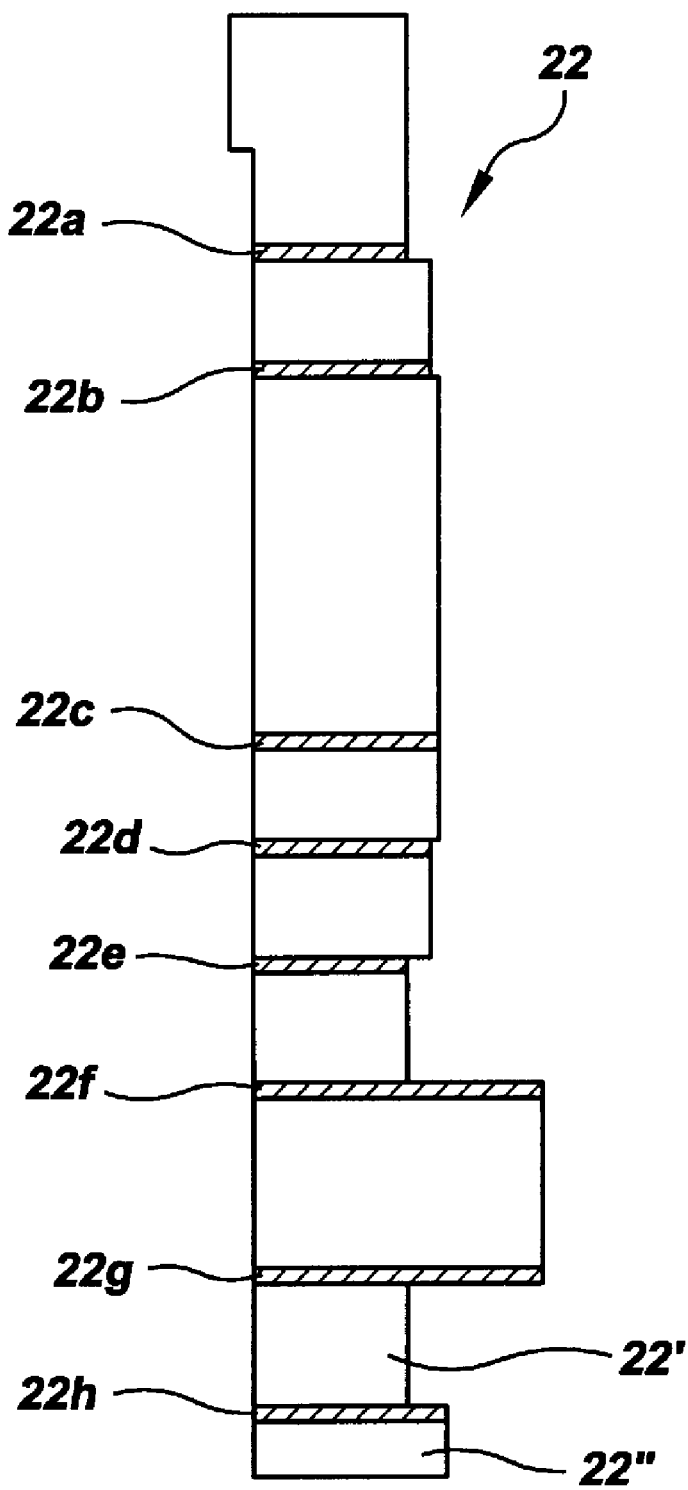
FIG. 4 is a plan view of a more complex OPC created polygonal shape for a mask element after horizontal fracturing.

The design of mask elements for the opaque segments corresponding to a more complicated desired integrated circuit pattern is depicted in FIG. 4. After otherwise conventional fracturing, mask element design 22 is composed of different rectangular segments that are separated by slivers, i.e., narrow rectangular portions. These slivers may be horizontal and/or vertical in orientation. In the case of mask element design 22, horizontal slivers 22a, 22b, 22c, 22d, 22e, 22f, 22g and 22h are shown in FIG. 4 separating larger mask element design segments. Likewise, vertical fracturing may result in vertically oriented slivers. While the examples discussed below are of horizontal slivers, the same methods may be used in the case of vertical slivers, or the view of the vertical slivers may simply be rotated 90° and treated as horizontal slivers.

Figure 5:
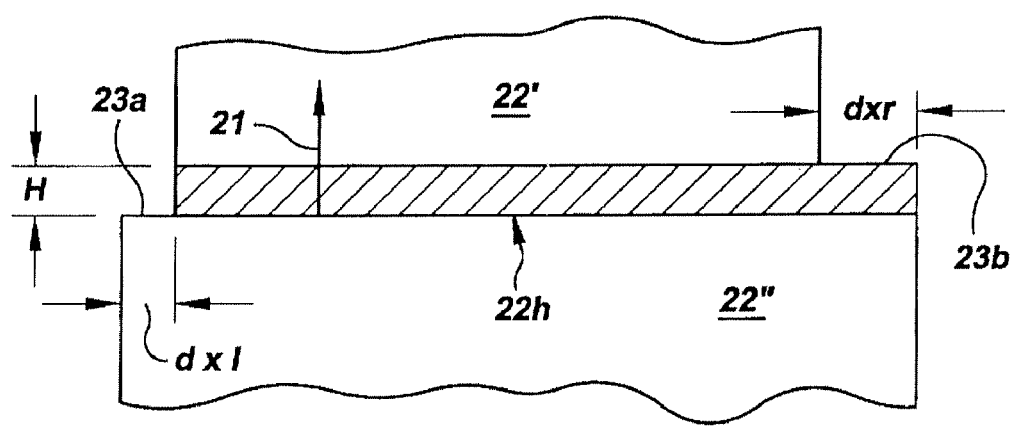
FIG. 5 is a close-up view of one of the slivers created by fracturing of a mask element of FIG. 4.

FIG. 5 shows a close up of rectangular sliver 22h of FIG. 4 disposed between rectangular segment 22' above and segment 22" below. Sliver 22h has a thickness or height H that is typically less than about 30 nm, or some other dimension that is difficult for the particular mask writer to resolve. On the right side, the sliver extends to the right edge of segment 22", which is a distance dxr beyond the right edge of segment 22'. On the left side, the sliver extends to the left edge of segment 22', which is a distance dxl inward of the left edge of segment 22". The "right jog" of the sliver is considered to be the length of line extension of sliver 22h beyond the right edge of segment 22', indicated as 23b, and the "left jog" of the sliver is considered to be the length of line extension of segment 22" beyond the left edge of segment 22' and sliver 22h, indicated as 23a. A positive sliver distance extends upward from the sliver lower side, as indicated by arrow 21, and a negative sliver distance is the opposite.

Figure 6:
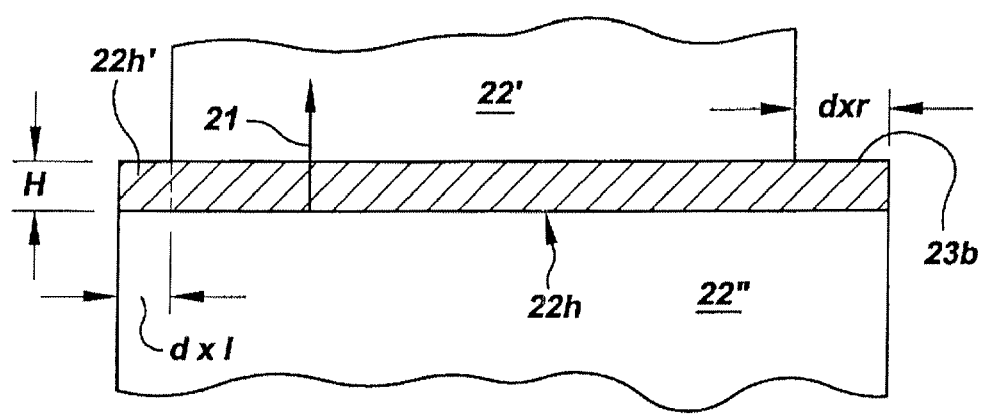
FIG. 6 is a view of the sliver of FIG. 5 after modification in accordance with the method of the present invention.

To improve resolution, in accordance with the preferred method of the present invention, the sliver may be modified by either adding to its width (horizontally in FIG. 5), or subtracting from its width. If the sliver left jog is relatively lower than the right jog (vertically), as is the case for sliver left jog 23a with respect to right jog 23b, then the following additional factors are considered. If the left jog width is smaller than the right jog width, as is also the case in FIG. 5, the horizontal width of sliver 22h is lengthened by the amount of the left jog, i.e., dxl. This is shown in FIG. 6, by sliver segment 22h' added to the left edge of sliver 22h. If the left jog width were larger than the right jog width, then the horizontal width of sliver 22h would be shortened by the amount of the right jog, i.e., dxr.

On the other hand, if the left jog were higher than the right jog, then the following factors are considered. If the left jog width is smaller than the right jog width, the horizontal width of the sliver would be shortened by the amount of the left jog. If the right jog width is smaller than the left jog width, the horizontal width of the sliver would be lengthened by the amount of the right jog. Preferably, the maximum change on dimension of a sliver, either lengthening or shortening, is about one-eighth to one-quarter the minimum width groundrule for the semiconductor generation.

In either case, once the sliver is shortened or lengthened as described above, it is effectively eliminated. In FIG. 6, for example, the modified sliver 22h is merged with and becomes part of segment 22", since the addition of modified sliver 22h and segment 22' form a rectangle. Thus, the method of the present invention eliminates an undesirable, poorly resolvable sliver.

Figure 7:
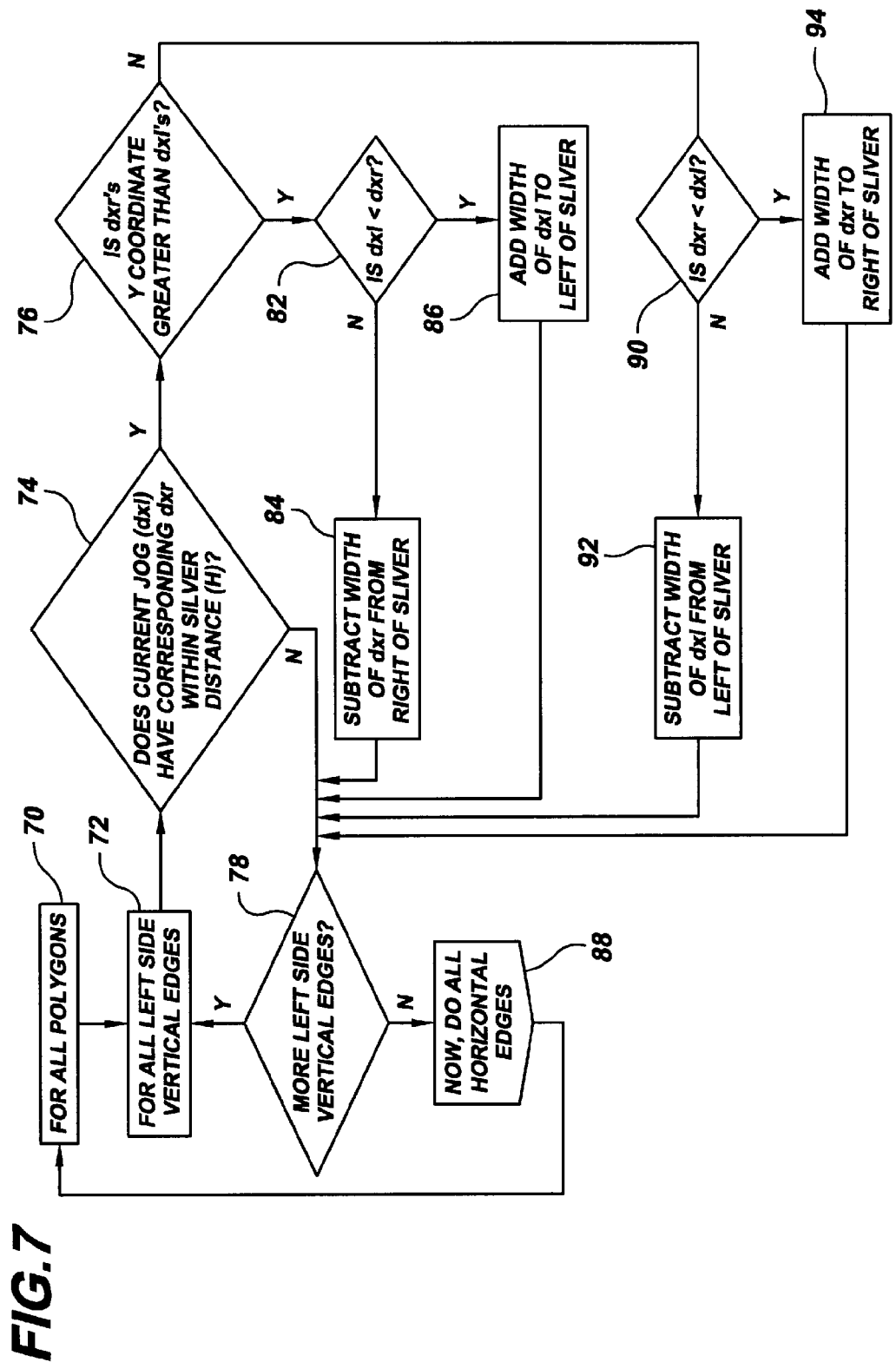
FIG. 7 is a flow chart showing the steps of a preferred embodiment of the present method.

In general, the steps for evaluating and modifying slivers in accordance with the present invention is are shown in FIG. 7. For all polygons 70 created by the fracturing routine, all left side vertical edges are measured 72 to determine if there is present an edge of a sliver. The method then determines 74 whether there exists a sliver of height H with a current left side jog (dxl) having a corresponding right side jog (dxr) within the sliver height H. If this condition does not exist, one then determines 78 if there are other slivers along the left side vertical edge and step 72 is repeated for such sliver edges. If the aforedescribed condition is true, one determines 76 whether the y coordinate of the right side jog (dxr) is greater (higher) than that of the left side jog (dxl). If the y coordinate of the right side jog (dxr) is greater than that of the left side jog (dxl), one then determines 82 whether the length of the dxl sliver is less than the length of the dxr sliver. If this is true 86, then the sliver is lengthened on the left edge by the distance dxl. If this is false 84, the sliver is shortened on the right edge by the distance dxr. After the lengthening or shortening, one then determines 78 if there are other slivers along the left side vertical edge and step 72 is repeated for such sliver edges. Returning to step 76, if the y coordinate of the right side jog (dxr) is less (lower) than that of the left side jog (dxl), one then determines 90 whether the length of the dxr sliver is less than the length of the dxl sliver. If this is true 94, then the sliver is lengthened on the left edge by the distance dxl. If this is false 84, the sliver is shortened on the right edge by the distance dxr. After the lengthening or shortening, one then determines 78 if there are other slivers along the left side vertical edge and step 72 is repeated for such sliver edges. Once all of the left side vertical sliver edges are considered, the horizontal edges are considered. This may be done by rotating the image of the fractured rectangular segments 90°, and beginning again at step 72. After the lengthening of shortening of the sliver as described above, the polygonal shape of the modified sliver merges with the polygonal shape of an adjacent mask element design segment above or below the sliver.

Figure 8:
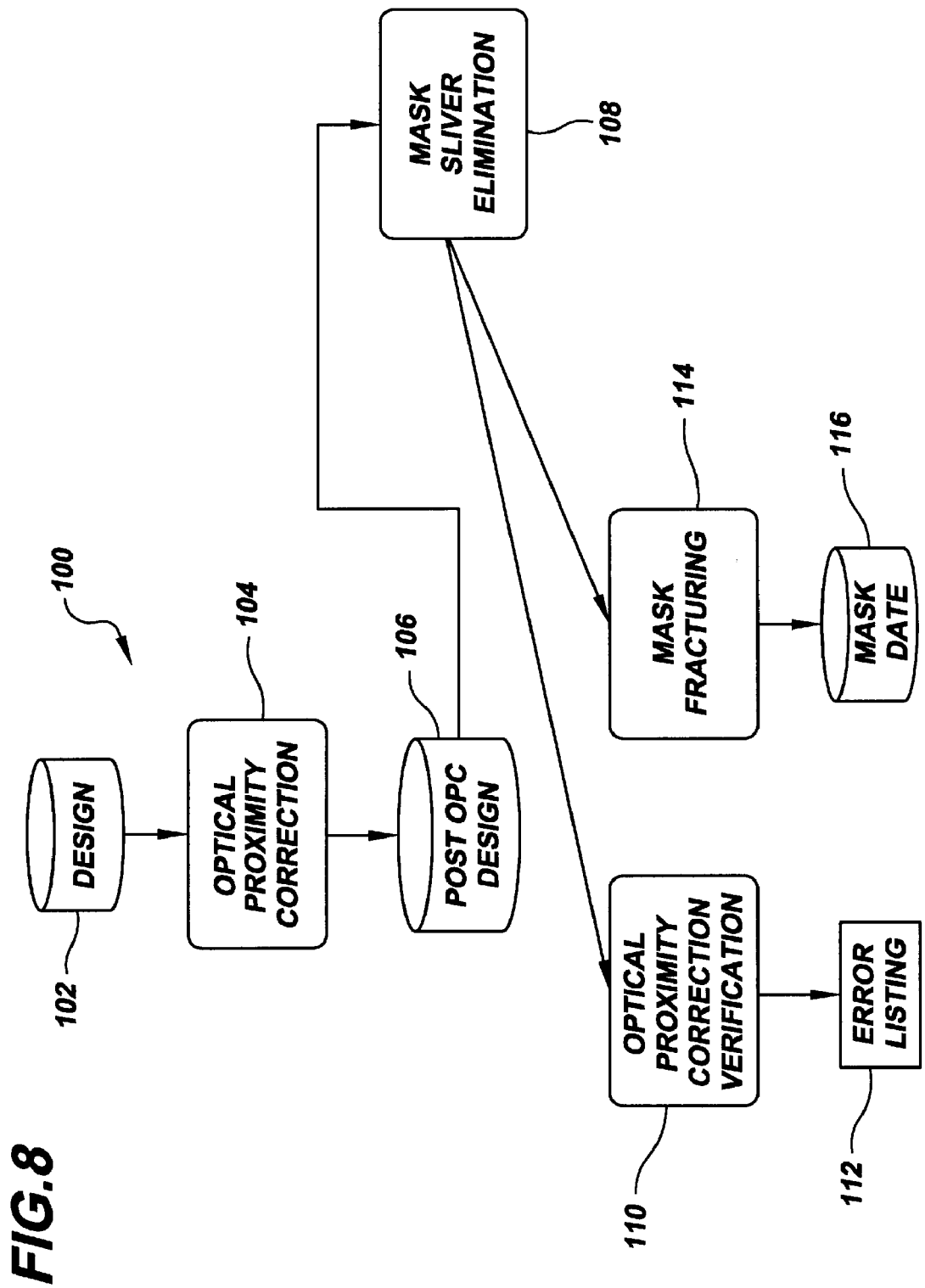
FIG. 8 is a flow chart showing one embodiment of the incorporation of the method of the present invention into the creation of a mask design.

The method of evaluating and modifying slivers as described herein may be performed at a number of places within the processing flow. The method may be performed during OPC or immediately thereafter, during OPC verification, or during mask fracturing. As shown in FIG. 8 in a preferred embodiment of the method 100, the mask elements conforming to the desired circuit patterns are first designed 102 and then subjected to optical proximity correction 104 and post-OPC design check(s). Subsequently, the aforedescribed method of evaluating and modifying slivers is performed 108, and the corrected mask mask fracturing 114 and completion of the mask design data.

Following, the completion of the design of the mask elements, the mask is produced for use in a lithographic production system by otherwise conventional electron or other beam mask writing methods.

Thus, the present invention provides improved mask resolution of integrate circuit designs and optimization of optical proximity correction of mask elements used to project the circuit design in a lithographic projection system. The method of the present invention will find within a given polygon potential mask resolution problems due to forced slivers in fracturing, and modify the polygon edges to eliminate sliver production. These modifications eliminate the creation of very small shapes (slivers) in the subsequently produced mask fracturing data that at minimum reduce and more preferably completely eliminate poorly resolving shapes on the mask. The result is improved semiconductor wafer yield.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of designing a mask used for projecting an image of an integrated circuit design comprising:
    providing a mask element corresponding to a portion of a design of an integrated circuit layout;
    correcting the mask element using optical proximity correction (OPC) techniques;
    dividing the OPC-corrected mask element into a plurality of polygonal segments;
    identifying a segment of the OPC-corrected mask element having lower resolution by a mask writer used to design the mask, the segment comprising a sliver created by fracturing the mask element;
    modifying configuration of the identified mask element segment to add area to or subtract area from an end of the segment; and
    after adding or subtracting area to an end of the segment, merging the identified mask element segment with an adjacent mask element segment to create a corrected mask element having increased resolution by the mask writer.

2. The method of claim 1 wherein the configuration of the identified mask element segment is modified by increasing length of the identified segment.

3. The method of claim 1 wherein the configuration of the identified mask element segment is modified by reducing length of the identified segment.

4. The method of claim 1 wherein the configuration of the identified mask element segment is modified by increasing length of the sliver.

5. The method of claim 1 wherein the configuration of the identified mask element segment is modified by reducing length of the sliver.

6. The method of claim 1 further including forming a mask having the mask element with modified configuration.

7. the method of claim 1 wherein the segment has a thickness of less than that which can be normally reproduced on the mask.

8. The method of claim 1 wherein the segment of the OPC-corrected mask element having lower resolution by a mask writer is identified by fracturing the mask element to a plurality of polygonal segments, identifying along one edge of the mask element a polygon edge having a thickness less than that which can be normally reproduced on the mask, and changing the length of the polygon in a direction normal to the mask element such that the polygon merges with an adjacent polygonal segment.

9. The method of claim 8 wherein the polygon is lengthened.

10. The method of claim 8 wherein the polygon is shortened.

11. The method of claim 8 wherein the polygon is shortened or lengthened along the polygon edge along the one edge of the mask element.

12. The method of claim 8 wherein the polygon is shortened or lengthened along the polygon edge opposite the one edge of the mask element.

13. The method of claim 8 further including using an electron beam mask writer to form a mask having the mask element with modified configuration.

14. A method of forming a mask used for projecting an image of an integrated circuit design comprising;
    providing a mask element corresponding to a portion of a design of an integrated circuit layout;
    correcting the mask element using optical proximity correction (OPC) techniques;
    fracturing the OPC-corrected mask element into a plurality of polygonal segments;
    identifying along an edge of the mask element a polygon sliver, created by fracturing the mask element, having a thickness less than that which can be normally reproduced by a mask writer used to design the mask;

modifying configuration of the identified mask element segment to add length to or subtract length from an end of the polygon;

after adding length to or subtracting length from an end of the polygon in the identified mask element segment, merging the identified mask element segment with an adjacent mask element segment to create a corrected mask element having increased resolution by the mask writer; and using a mask writer to form a mask having the mask element with modified configuration.

15. The method of claim 14 wherein the polygon is lengthened.

16. The method of claim 14 wherein the polygon is shortened.

17. The method of claim 14 wherein the polygon is shortened or lengthened along the polygon edge along the one edge of the mask element.

18. The method of claim 14 wherein the polygon is shortened or lengthened along the polygon edge opposite the one edge of the mask element.

19. The method of claim 14 wherein the mask writer is an electron beam mask writer.

* * * * *